United States Patent
McShea

(10) Patent No.: US 8,111,796 B2
(45) Date of Patent: Feb. 7, 2012

(54) METHOD AND SYSTEM FOR SWITCHING BETWEEN TWO (OR MORE) REFERENCE SIGNALS FOR CLOCK SYNCHRONIZATION

(75) Inventor: Matthew Duane McShea, Westminster, CO (US)

(73) Assignee: Avaya Inc., Basking Ridge, NJ (US)

( * ) Notice: Subject to any disclaimer, the term of this patent is extended or adjusted under 35 U.S.C. 154(b) by 169 days.

(21) Appl. No.: 12/712,819

(22) Filed: Feb. 25, 2010

(65) Prior Publication Data
US 2010/0172455 A1    Jul. 8, 2010

Related U.S. Application Data

(62) Division of application No. 11/242,707, filed on Oct. 3, 2005, now Pat. No. 7,697,647.

(51) Int. Cl.
*H04L 7/04* (2006.01)
(52) U.S. Cl. ........ 375/362; 375/354; 375/355; 375/373; 375/364; 375/376
(58) Field of Classification Search ................. 375/354, 375/355, 373, 364, 362
See application file for complete search history.

(56) References Cited

U.S. PATENT DOCUMENTS

| | | | |
|---|---|---|---|
| 5,515,403 A | 5/1996 | Sloan et al. | |
| 5,648,964 A | 7/1997 | Inagaki et al. | |
| 5,754,607 A | 5/1998 | Powell et al. | |
| 7,283,601 B2 * | 10/2007 | Tamura et al. | 375/373 |
| 7,366,267 B1 * | 4/2008 | Lee et al. | 375/354 |
| 7,382,847 B2 * | 6/2008 | Adkisson et al. | 375/371 |
| 7,453,970 B2 | 11/2008 | Cheung et al. | |
| 7,599,460 B2 * | 10/2009 | Matsuo et al. | 375/373 |
| 7,697,647 B1 | 4/2010 | McShea | |
| 2005/0105716 A1 | 5/2005 | Das et al. | |
| 2006/0233291 A1 | 10/2006 | Garlepp et al. | |

OTHER PUBLICATIONS

Official Action for U.S. Appl. No. 11/242,707, mailed May 13, 2009.
Notice of Allowance for U.S. Appl. No. 11/242,707, mailed Dec. 7, 2009.

* cited by examiner

*Primary Examiner* — Kenneth Lam
(74) *Attorney, Agent, or Firm* — Sheridan Ross P.C.

(57) ABSTRACT

An apparatus and method is disclosed for synchronizing a timing signal for a computational system to different reference clock signals without impairing the operation of the computational system. A corresponding "offset" register is provided for each of the reference clock signals (RCS) for storing signal timing differences between the timing signal and RCS. When one of the reference clock signals not used for synchronizing the timing signal, is selected as the signal for synchronizing the timing signal, the corresponding offset register $R_0$ (for the newly selected reference clock signals) retains its last value prior to the switch, and another register $R_1$ stores subsequent signal timing differences between the timing signal and the newly selected reference clock signals. To synchronize the timing signal with the new reference clock signal without distorting the timing signal and impairing the operation of the computation system, differences between $R_1$ and $R_0$ are output (for successive time intervals) for iteratively adjusting the timing signals. The contents of the offset register $R_0$ is incrementally changed toward a predetermined value (i.e., zero) thereby gradually adjusting the timing signals to factor in a potentially large timing change when switching between reference clock signals.

7 Claims, 8 Drawing Sheets

Fig. 1 (Prior Art)

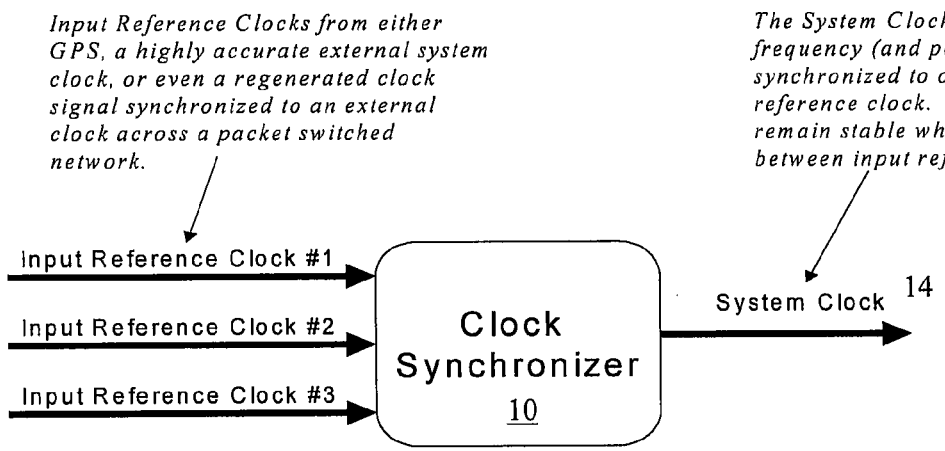

*Input Reference Clocks from either GPS, a highly accurate external system clock, or even a regenerated clock signal synchronized to an external clock across a packet switched network.*

*The System Clock signal's frequency (and possibly phase) is synchronized to one input reference clock. This clock must remain stable when switching between input reference clocks.*

Tapped Delay Line

METHOD AND SYSTEM FOR SWITCHING BETWEEN TWO (OR MORE) REFERENCE SIGNALS FOR CLOCK SYNCHRONIZATION

CROSS REFERENCE TO RELATED APPLICATION

This application is a divisional application of U.S. Ser. No. 11/242,707, filed Oct. 3, 2005, entitled "METHOD AND SYSTEM FOR SWITCHING BETWEEN TWO (OR MORE) REFERENCE SIGNALS FOR CLOCK SYNCHRONIZATION", the disclosure of which is incorporated herein by reference in its entirety.

BACKGROUND

Clock synchronization is the process by which the frequencies of two separate system clock signals are synchronized together to prevent information loss between the two computational systems. For example, clock synchronization plays a central role in determining the quality of service provided between two systems, (e.g., for maintaining a particular quality of service for voice transmissions, for data transmissions to modems, for Fax transmissions, for TTY transmissions, for Bonded Video transmissions, etc).

Often times, there are multiple input clock signals that can be used as timing synchronization reference sources for a system clock of a computational system (e.g., data and voice E1/T1 trunks may provide clock synchronization signals to a computational system from various sources; moreover, a single computational system may have multiple E1/T1 trunks providing clock synchronization signals thereto). FIG. 1 shows a block diagram of a clock synchronizer 10 for a computational system (not shown), wherein the clock synchronizer receives multiple input reference clock signals (denoted herein as input reference clocks #1, #2, and #3), and outputs a system clock signal 14 for the computational system (this signal denoted herein as a system clock 14).

When a computational system is provided with multiple input reference clocks, switching between such reference clocks must be performed in a manner that guarantees the stability of the output system clock 14. In particular, most computational systems are known to have a limited capacity for operating as desired if there is a substantial abrupt change in system clock phase (especially since this would result in a instantaneous change in frequency).

Most common clock synchronization schemes include the use of a Digital Phase Locked Loop (DPLL) 30 (FIG. 2) along with some extra circuitry to provide clock switching. Basically the phase difference between the input reference clock #1 (FIG. 2), and the output system clock 14 is measured using a phase detector 32, and depending upon the direction and size of the (any) phase error detected, the frequency of the system clock 14 is increased or decreased by changing an input to a numerically controlled oscillator 34 (NCO) as one skilled in the art will understand. That is, the DPLL 30 synchronizes an output system clock 14 to the input reference clock #1 via use of a signal feedback connector 35. However, such a DPLL 30 does not facilitate or perform switching between two input reference clocks. Accordingly, support circuitry 36 (FIG. 3) is typically added in front of the phase detector 32 of the DPLL 30 in order to appropriately switch between two (or more) input reference clocks. Such support circuitry 36 generally includes a plurality of programmable delay circuits 38 (e.g., one for each of the input clock references #1 and #2) for generating "virtual" phase aligned versions of the input reference clocks. That is, at least one of the input reference clocks #1 or #2 (FIG. 3) has its phase and/or frequency adjusted by a corresponding one of the programmable delay circuits 38 so that the resulting "virtual" clocks signals (i.e., virtual input reference clocks #3 and #4) are phase aligned. Accordingly, once the virtual input reference clocks #3 and #4 are synchronized (i.e., phase aligned), switching between the two input reference clocks can proceed, wherein the support circuitry 36 gradually changes the virtual input reference clock #5 (FIG. 3) so that it becomes substantially a copy of the input reference clock signal that has been switched to. Accordingly, the clock signal input to the DPLL 30 does not change significantly during the switch, which in turn means that the output system clock 14 will not change abruptly.

There are, however, problems with such typical implementations of the circuitry 36. First, the programmable delay circuitry 38 is usually implemented using some type of tapped delay line 40 (FIG. 4). The tapped delay line 40 includes multiple flip-flops 42 (FIG. 4) and a proportionally sized multiplexer 43. Accordingly, tapped delay lines 40 are expensive because they require a flip flop for every phase step that is required, as one skilled in the art will understand. Thus, if a tapped delay line 40 operates at 20 MHz, and the input reference clock 44 (FIG. 4) frequency is 8 kHz, then in order to handle phase differences up to 180 degrees, approximately 1250 flip-flops 42 are required for each of the programmable delay circuits 38. Additionally, program logic (e.g., a multiplexer) must be supplied to control which tapped delay line 40 (i.e., programmable delay circuit 38 in FIG. 3) is to be activated, and extra logic is required for operating the compare 46 and control circuits 48 shown in FIG. 3.

Accordingly, it is desirable to have a less complex, less costly embodiment of a clock synchronizer. The proposed solution provides a method to keep the system clock stable while switching between two reference clocks with differing phases.

SUMMARY

An apparatus and method for synchronizing a system clock signal of a computational system or device to a reference clock signal is disclosed, wherein such synchronization includes at least frequency synchronization, and in some embodiments phase alignment as well. In particular, the apparatus and method disclosed (herein referred as a "clock synchronizer") provides for synchronization to a new reference clock signal, wherein the clock synchronizer switches from a current reference clock signal to the new reference clock signal without impairing the operation of the computational system or device to which the clock synchronizer is attached. More particularly, the clock synchronizer provides a simple technique to at least initially maintain an initial phase offset between two reference clock signals (i.e., input reference clocks herein) while switching between the two reference clocks so that there is no sudden change in the frequency or phase of the system clock signal.

In one embodiment, the clock synchronizer disclosed herein uses, for each of a plurality of input reference clocks, a single corresponding phase detector together with two registers for storing signal phase information related to phase offsets between the input reference clock and the current system clock of the computational system or device (hereinbelow, also merely "computational system"). In particular, for each input reference clock (IRC), the two registers are:

(a) a signal phase error register ($PER_{IRC}$), also referred to as a "phase error register" herein, for storing the total phase difference between the phase of the current system clock signal (e.g., system clock signal 14) for the computational system to which the clock synchronizer is operably attached, and the phase of the input reference clock IRC; and (b) a phase offset register ($POR_{IRC}$) for storing a signal phase offset between the phase of the current system clock signal for the computational system to which the clock synchronizer is operably attached, and the phase of the input reference clock IRC. This phase offset is not considered to be a phase error to be corrected by any subsequent phase error correcting circuitry (e.g., a numerically controlled oscillator 34, also denoted "NCO" herein), but rather, merely a phase difference between the system clock signal for the computational system, and the phase of the current input reference clock IRC, wherein this phase difference may be used to account for and accommodate a phase shift between the system clock signal and the current IRC, or this phase difference may be used to gradually phase align the two signals.

Accordingly, when the system clock is being synchronized to a given one of the input reference clocks, IRC, a substantially constant shift in the phases between the two clocks can be tolerated since the clock synchronizer includes circuitry for eliminating such a substantially constant phase shift; i.e., the circuitry performs the correction: $(PER_{IRC})$-$(POR_{IRC})$. Additionally, if the two clocks are to be phase aligned, then such a substantially constant phase shift can be reduced over time without causing timing malfunctions in the computational system that uses the system clock signal.

Moreover, the phase offset registers can be used for a switch over from one input reference clock signal to another so that the switch over provides no detrimental effect on downstream clock signal processing, and thus does not affect the system clock. Subsequently, in one embodiment, once a switch over has occurred, the phase offset register, corresponding to the newly switched over input reference clock, can be adjusted at a sufficiently gradual rate so that the downstream phase error correcting circuitry can bring the system clock into phase alignment with this new input reference clock without abruptly changing the system clock phase. Thus, the present clock synchronizer can use the contents of the phase offset register for the new input reference clock as a simple counter that is decremented (or incremented) over time to adjust the phase of the system clock without undesirably affecting the operation of the computational system. However, it is important to note that such adjustments are not necessary in all embodiments of the clock synchronizer. In particular, since a switch over between different reference clock signals results in substantially unchanged timing signals to the computational system, the gradual subsequent adjustment to phase align the system clock signals with the new reference clock signals may be optional and/or unnecessary.

The present clock synchronizer (system and method) thereby provides for switching between any input reference clocks at substantially any time. Moreover, there is no requirement to predetermine an ordering for switching between a plurality of input reference clocks. Thus, the present clock synchronizer is particularly useful in the event that multiple input reference clocks fail concurrently as may happen during a catastrophic failure.

Additionally, the present clock synchronizer does not require substantial extra control logic for controlling, e.g., one or more programmable delay circuits (e.g., programmable delay circuits 38, as shown in FIG. 3). Thus, such a reduction in control logic may provide a faster response to switching between input reference clocks.

The present clock synchronizer advantageously also can be implemented using substantially fewer flip-flops than the approximately 1250 flip-flops of prior art clock synchronization units. In particular, the present clock synchronizer can be implemented with about 40 to 50 flip-flops per input reference clock.

Other features and/or benefits of the clock synchronization system and method will become evident from the description hereinbelow together with the accompanying drawings.

BRIEF DESCRIPTION OF THE DRAWINGS

FIG. 1 shows a very high level block diagram of a prior art clock synchronizer 10 with multiple input reference clocks.

DETAILED DESCRIPTION

Figure 5:
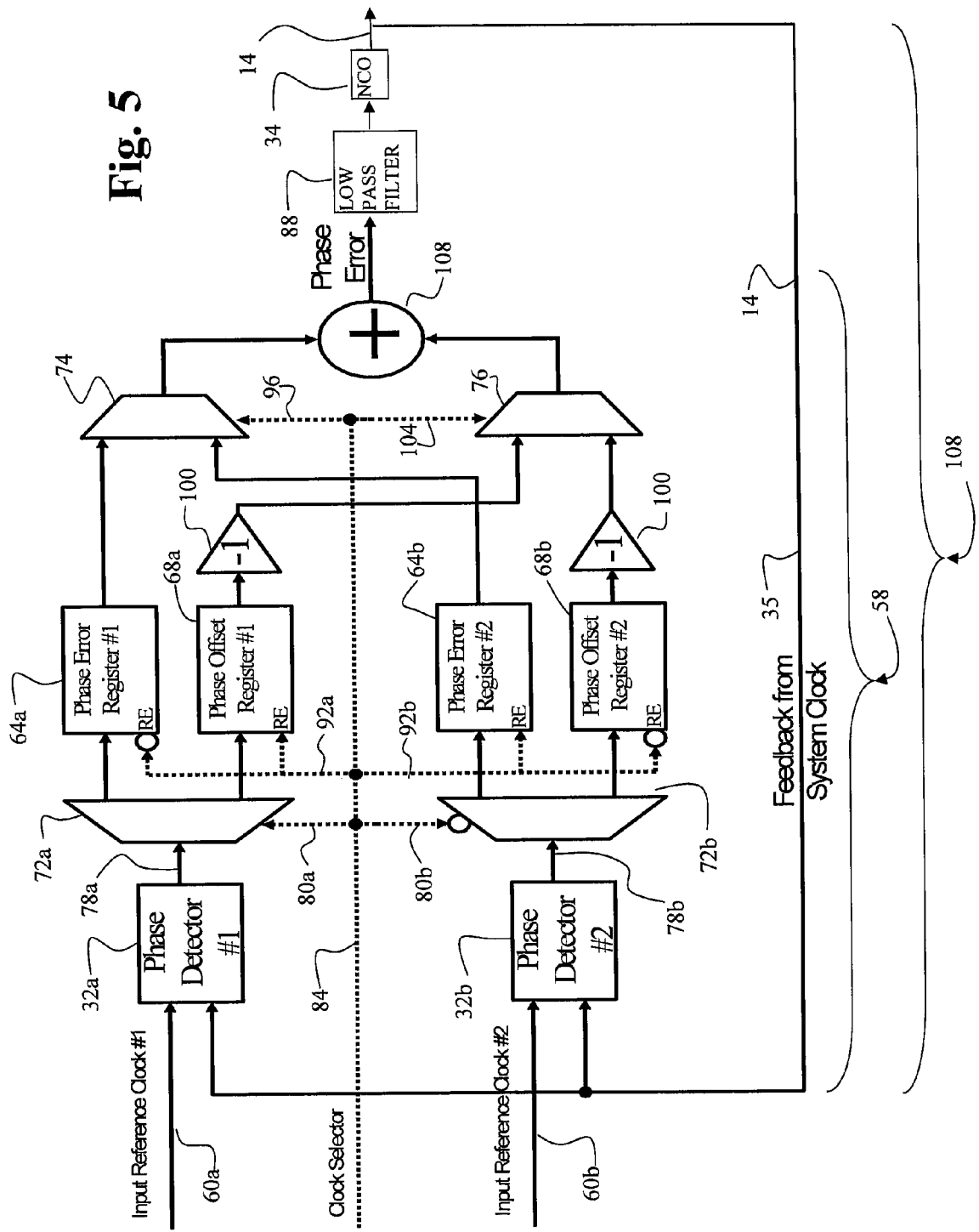
FIG. 5 shows an embodiment of the circuitry for the novel clock synchronizer 58 and corresponding synchronization method disclosed herein.

FIG. 5 shows a block diagram of the novel clock synchronizer 58 wherein two input reference clock signals 60a and 60b are input thereto. Notice that the input reference clock signals 60a and 60b have corresponding phase detectors (32a and 32b, respectively), phase error registers (64a and 64b, respectively), phase offset registers (68a and 68b, respectively), and supporting multiplexers (72a and 72b, respectively). Additionally, there are also downstream multiplexers 74 and 76 described further hereinbelow.

When a feedback signal from the system clock signal 14 (via the signal feedback connector 35) is received at the phase detectors 32 (i.e., 32a and 32b), each phase detector 32 outputs a signal indicative of the phase error between a corresponding one of the reference clock signals 60, and the system clock signal 14. Each phase error indicative signal (also referred to as "phase signal" herein) is output to a corresponding multiplexer 72 (via a corresponding one of the connections 78a and 78b). Each of the multiplexers 72 also receives (via a corresponding one of the connections 80a and 80b) clock selection signals 84 provided by the computational system (this system is not shown), this system being at least frequency synchronized (and in some embodiments, phase aligned) with one of reference clock signals 60. Note that such clock selection signals 84 identify the current reference clock signal 60 being used to adjust the system clock signal 14. Additionally, for each of the multiplexers 72 (i.e., 72a and 72*b*), such clock selection signals 84 cause the multiplexer 72 to output its input phase signals to a different one of the registers of the corresponding pair of registers 64 and 68 that is shown (in FIG. 5) receiving input from the multiplexer 72.

For each reference clock signal 60, its corresponding phase error register 64, when enabled, stores the total phase error between this reference clock signal and the system clock signal 14. Thus, in FIG. 5, phase error register 64*a* (respectively, 64*b*), when enabled, stores the total phase error between the reference clock signal 60*a* (respectively, 60*b*), and the system clock signal 14.

Additionally, for each reference clock signal 60, its corresponding phase offset register 68 stores phase offset values, wherein in some embodiments, these values are used to progressively adjust the phase of the system clock signal 14 into closer phase alignment with this reference clock signal. In a typical embodiment, the phase offset value stored in each phase offset register 68 may range between the value stored in the corresponding phase error register 64 (i.e., the phase error register receiving input from the same multiplexer 72), and zero. If the embodiment of the clock synchronizer 58 supports phase alignment of the system clock signal 14 with the "current reference clock signal" (i.e., the reference clock signal 60 currently being used to phase adjust the system clock signal 14), then as the phase offset value stored in the corresponding phase offset register 68 is iteratively incremented closer to zero, the resulting phase error provided to the low pass filter 88 (and subsequently to the NCO 34) causes, within a brief time period after switching to this current reference clock signal, the system clock signal 14 to become substantially phase aligned with the current reference clock signal.

Each of the phase error registers 64 receives the clock selection signals 84 (via a corresponding one of the connectors 92*a* and 92*b*). Each of the phase error registers 64*a* and 64*b* uses the clock selection signals 84 for identifying whether or not the phase error register's corresponding input reference clock signal 60 (i.e., 60*a* for register 64*a*, and 60*b* for register 64*b*) is currently selected for use in adjusting the system clock signal 14. A phase error signal output from each of the phase error registers 64 is provided to the multiplexer 74, which, in turn, uses the clock signals 84 (via connector 96) to determine which of the phase error signals to output. Thus, for clock selection signals 84 identifying a particular one of the input reference clock signals 60 (e.g., 60*a* or 60*b*), the output from the phase error register 64 (corresponding to the particular input reference clock signals) is provided to the multiplexer 74.

Note that each of the phase error registers 64 and the phase offset registers 68 are selectively enabled and disabled via a corresponding register enable circuit (identified in FIG. 5 by the annotation "RE" in each box illustrating one of the registers 64 and 68). Each such a register enable circuit RE receives input from a corresponding one of the connectors 92, and uses this input for enabling and disabling the updating of the corresponding register 64 or 68. For example, the phase error register 64*a* will only have its contents updated by the multiplexer 72*a* when the corresponding register enable circuit RE receives a signal (via connector 92*a*) which is identified by the register enable circuit RE as a predetermined signal to allow or disallow updates to the register 64*a*.

Similarly, for each input reference clock signal 60, its corresponding phase offset register 68 is able to use the clock selection signals 84 (e.g., via a corresponding one of the connectors 92*a* and 92*b*) for identifying whether or not the phase offset register's reference clock signal 60 is currently selected for storing phase differences that can be subsequently used in, e.g., phase adjusting the system clock signal 14. A phase offset signal output from each of the phase offset registers 68 is first provided to one of the inverters 100 for inverting the numerical phase offset value (e.g., a value of 13 would be inverted to −13). Subsequently, each of the inverted phase offset values is provided to the multiplexer 76, which, in turn, uses the clock signals 84 (via connector 104) to determine which of the inverted phase offset signals (equivalently, values) to output. That is, in FIG. 5, for clock selection signals 84 identifying a particular one of the input reference clock signals 60 (e.g., 60*a* or 60*b*), the inverted output from the phase offset register 68 (corresponding to the particular input reference clock signals) is output by the multiplexer 76.

Figure 2:
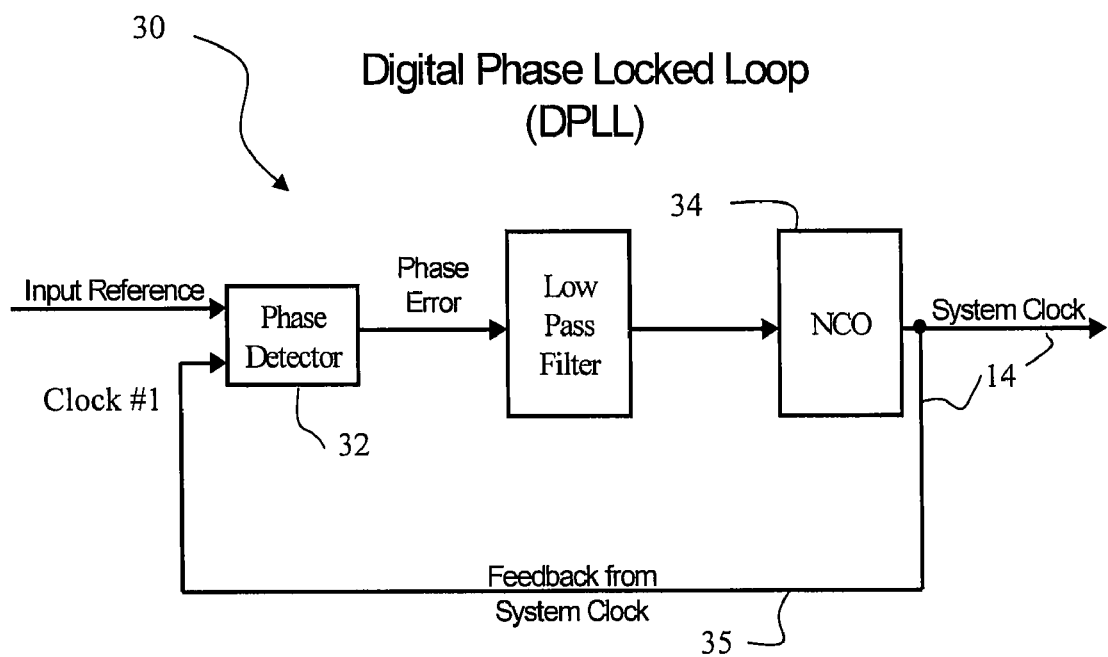
FIG. 2 is a block diagram of a prior art digital phase locked loop 30 (DPLL).
Figure 3:
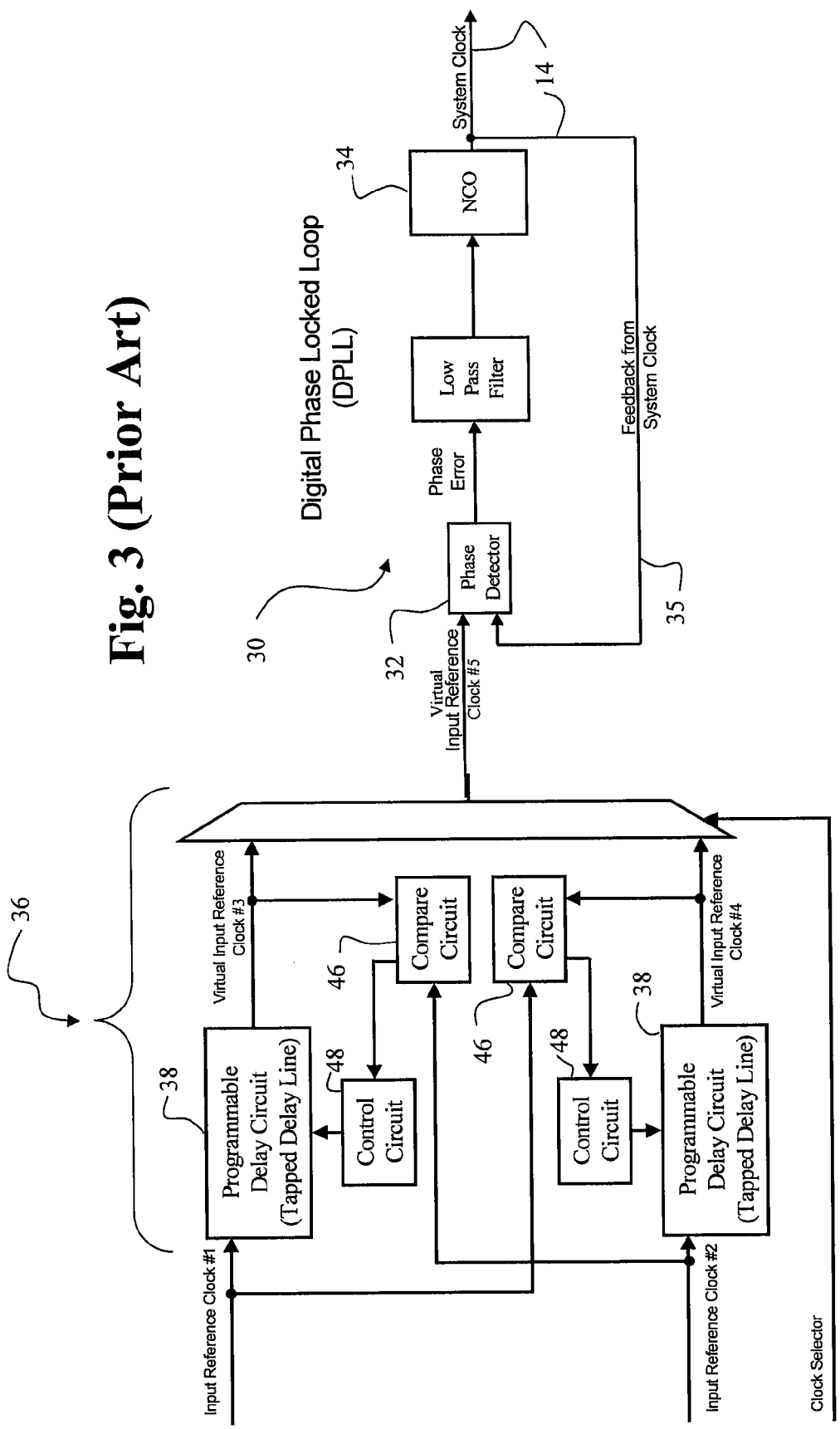
FIG. 3 shows a prior art block diagram of two different input reference clocks #1 and #2, and the supporting circuitry required to switch between them and to create the phase aligned virtual input reference clocks #1 and #2.
Figure 4:
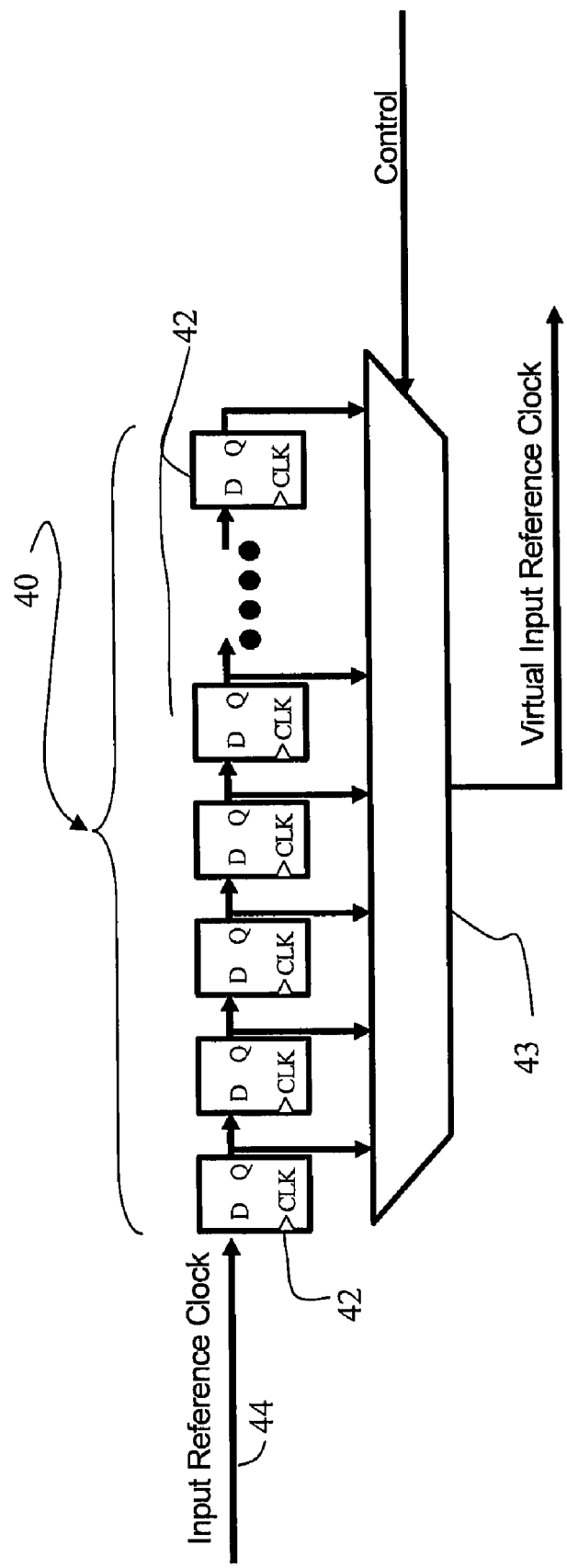
FIG. 4 shows a high level diagram of a prior art tapped delay line 40.

Subsequently, the outputs from the multiplexers 74 and 76 are summed in summer 108, and the sum is provided to the low pass filter 88, wherein the phase adjustment of the system clock signal 14 proceeds substantially in a conventional manner (e.g., as in FIG. 3). However, it is important to notice that instead of placing one or more clock signal processing components in front of a DPLL (as is typically done in the prior art, e.g., FIG. 3), the clock synchronizer 58 is a part of a DPLL 108. More specifically, the clock synchronizer 58 is designed to replace the phase detector 32 shown in FIG. 2.

Note that embodiments of clock synchronizer 58 are not limited to switching between merely two reference clock signals 60*a* and 60*b*. The description herein can be readily extended to substantially any number of reference clock signals as one skilled in the art will understand. In particular, it is not unreasonable for there to be between three and eight such distinct reference clock signals 60. Moreover, the description of the clock synchronizer 58 herein straightforwardly extends for such a range in the number reference clock signals 60. For example, for each pair of substantially identical components of the clock synchronizer 58 in FIG. 5 (e.g., the pairs: (1) phase detectors 32*a* and 32*b*; (2) phase error registers 64*a* and 64*b*; (3) phase offset registers 68*a* and 68*b*; and (4) multiplexers 72*a* and 72*b*), there can be a corresponding additional substantially identical component for frequency synchronizing and/or phase aligning the system clock signals 14 with yet another reference clock signal (e.g., a reference clock signal 60*c*, not shown).

Figure 6:
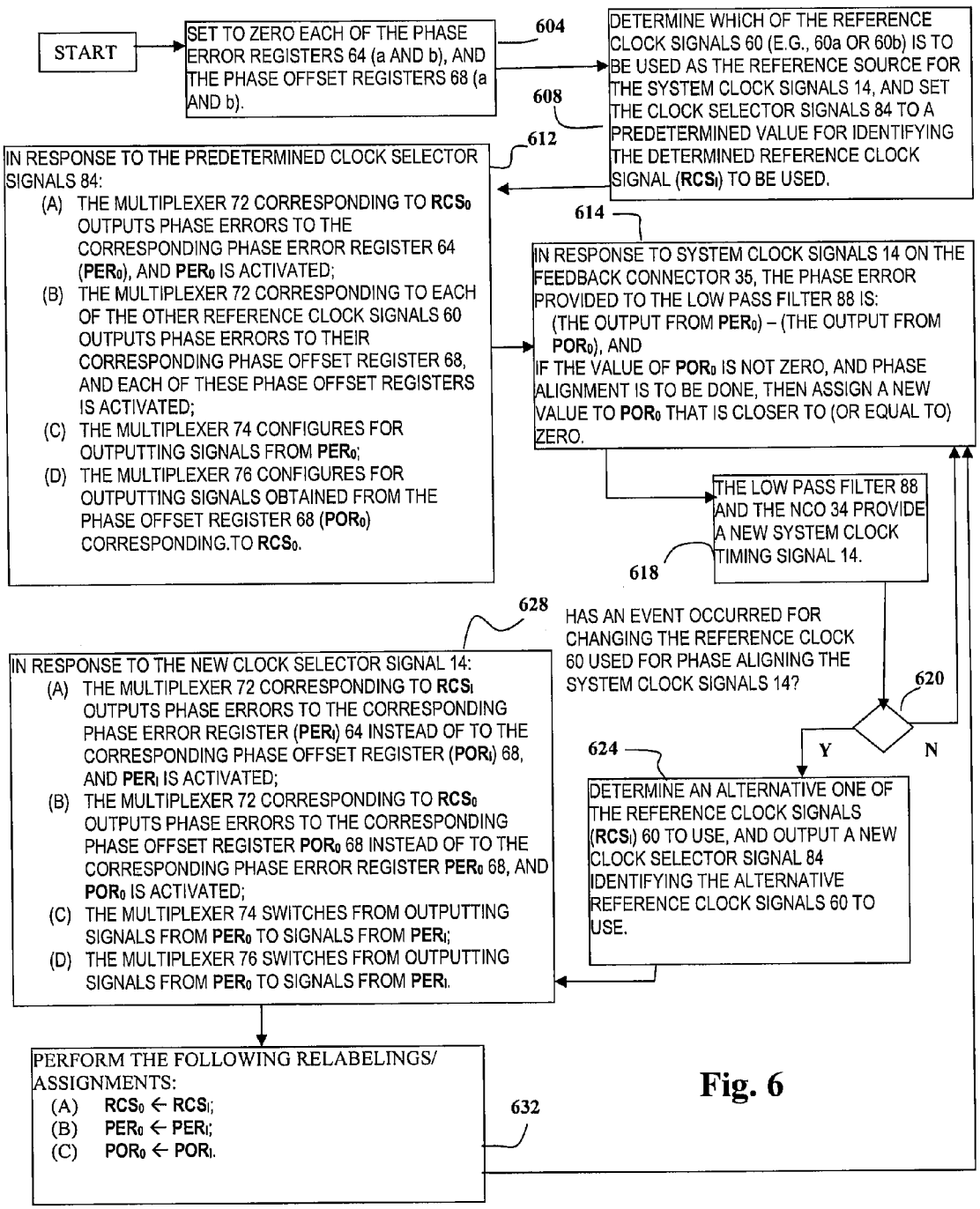
FIG. 6 is a flowchart illustrating the high level steps performed by the clock synchronizer 58 disclosed herein.

Operation of the clock synchronizer 58 is shown in the flowchart of FIG. 6, and is described as follows. At startup the phase error registers 64 (e.g., 64*a* and 64*b*), as well as, the phase offset registers 68 (e.g., 68*a* and 68*b*) are set to zero (step 604). In step 608, a determination is made as to which of the reference clock signals 60 is to be used as the reference clock source for the system clock signals 14, and the clock selector signal 84 is set to a predetermined value indicative of the reference clock signal 60 ($RCS_0$) to be used. Subsequently, in step 612, the following substeps are performed:

(a) the multiplexer 72 corresponding to the reference clock signal $RCS_0$ determines that the clock selector signal 84 identifies $RCS_0$, and accordingly this multiplexer outputs phase errors to the corresponding phase error register 64 ($PER_0$); e.g., if the multiplexer 72*a* corresponds to the clock signal $RCS_0$ (i.e., reference clock signal 60*a*), then the multiplexer 72*a* outputs phase errors to the register 64*a*, and if the multiplexer 72*b* corresponds to the clock signal $RCS_0$ (i.e., reference clock signal 60*b*), then multiplexer 72*b* outputs phase errors to the register 64*b*; additionally, when $PER_0$ detects the clock selector signal 84 (via a corresponding one of the connectors 92), $PER_0$ is activated for receiving the multiplexer 72 output;

(b) for each of the multiplexer(s) 72 corresponding to the (one or more) additional reference clock signals 60 not selected as the reference clock for frequency synchronizing and/or phase aligning the system clock signals 14 thereto, the clock selector signal 84 causes the multiplexer 72 to output phase errors to the corresponding phase offset register 68 (POR); e.g., if the multiplexer 72a does not receive a predetermined signal via the connection 80a for selecting the input reference clock signal 60a, then this multiplexer outputs phase errors to the register 68a, and if the multiplexer 72b does not receive a (different) predetermined signal via the connection 80b for selecting the input reference clock signal 60b, then multiplexer 72b outputs phase errors to the register 68b. Additionally, when each such POR detects that the clock selector signal 84 (via a corresponding one of the connectors 92) does not identify POR's corresponding reference clock signal 60, then POR is activated for receiving the multiplexer 72 output via POR's register enable circuitry;

(c) upon sensing the clock selector signal 84 (via the connector 96), the multiplexer 74 configures for outputting signals from $PER_0$;

(d) upon sensing the clock selector signal 84 (via the connector 104), the multiplexer 76 configures for outputting signals from the phase offset register 68 ($POR_0$) corresponding to the clock signal $RCS_0$.

Accordingly, as indicated in step 614, the output ($OUT_{PER_0}$) from the register $PER_0$ is output from the multiplexer 74 to the summer 108, and the negative of the output ($OUT_{POR_0}$) from the register $POR_0$ is output from the multiplexer 76 to the summer 108. Thus, as also shown in step 614, the phase error provided to the low pass filter 88 is $OUT_{PER_0}$-$OUT_{POR_0}$. Note that since the register $POR_0$ is initially set to zero, the low pass filter 88 initially receives the total phase error $OUT_{PER_0}$. Hence, the initial phase error correction between $RCS_0$ and the system clock signals 14 provides substantially the same phase correction results as in FIGS. 2 and 3; i.e., the processing performed by the clock synchronizer 58 has substantially no effect. However, note that when the system clock signal 14 is to be at least frequency synchronized with an alternative reference clock signal 60 (as in steps 624, 628 and 632 discussed hereinbelow), the identifiers $RCS_0$, $PER_0$, and $POR_0$ are reassigned (step 632) to identify, respectively, a different reference clock signal 60, a different phase error register 64, and a different phase offset register 68. Accordingly, after such reassignments, the identifier $POR_0$ may not be zero upon some activations of step 614 (via a reactivation following step 623). Thus, if the system clock signal 14 is to be phase aligned (instead of only frequency synchronized) with the current reference clock signal 60, then step 614 also includes a substep of modifying $POR_0$ so that its value is closer to or equal to zero. That is, by modifying the phase value of $POR_0$ only a small amount with each performance of step 614 until the phase value of $POR_0$ becomes zero, the system clock signal 14 is gradually brought into phase alignment with the current reference clock signal 60 without disturbing the system clock signal 14 enough to cause computational system components (e.g., a CPU, busses, and telecommunications related components) to fail or malfunction. More precisely, between at least some outputs from the offset register 68 $POR_0$, the register's contents may be modified by an amount that will not adjust the phase of the system clock timing signals 14 enough to cause a fault in the computational system using such timing signals 14, but does adjust this phase to be more in-phase with the current reference clock signals 60 identified by $RCS_0$. In one embodiment, values in $POR_0$ are successively modified so that there is no more than a two degree phase change in the system clock timing signals 14 per millisecond. However, it is within the scope of the present disclosure that various modification increments may be utilized to gradually adjust the system clock timing signals 14 to become phase aligned with the selected reference clock signal 60. Accordingly, each of the phase offset registers 68 is configured so that if its phase related contents (equivalently, phase value) is not zero, then after outputting its contents to an inverter 100, the register's contents is modified to be closer to zero. Thus, as will be evident once the flowchart of FIG. 5 is fully understood, by incrementally changing the value of the identifier $POR_0$ as described here, the system clock signals 14 gradually become more phase aligned with the new reference clock signal 60.

Subsequently, in step 618, the low pass filter 88 together with the NCO 34 generate new system clock timing signals 14 for output to both the computational system (not shown), and to the phase detectors 32 via the feedback connector 35. Note that processing performed by the low pass filter 88 and the NCO 34 are substantially the same as the processing performed in a prior art DPLL, such as DPLL 30 of FIG. 2 or 3.

Subsequently, in step 620, a determination is made as to whether an event has occurred for changing the reference clock 60 used for frequency synchronizing and/or phase aligning the system clock signals 14 thereto. Note that such a determination may typically be made in response to an interrupt of the computational system (not shown) as one skilled in the art will understand, wherein the interrupt is due to, e.g., (1) a detection of a variance in phases between the current reference clock 60 and the system clock signals 14 of greater than 20 degrees (and no such variance with another one of the reference clocks 60 is detected), or (2) an input user command to switch to another reference clock 60. Thus, if such an event occurs, then in step 624 an alternative one of the reference clock signals (denoted herein, $RCS_I$) is identified for use in frequency synchronizing and/or phase aligning the system clock signals 14 thereto. Note that $RCS_I$ may be determined according to one of the following conditions: (i) $RCS_I$ may be predetermined so that, e.g., whenever the current reference clock signals is identified as faulty, $RCS_I$ is used; (ii) $RCS_I$ may be determined based on reliability in the recent past, e.g., within the previous day; (iii) $RCS_I$ may be determined based on an explicit request, e.g., from a user of the computational system.

Additionally note that in step 624, a new clock selector signal 84 is provided for identifying $RCS_I$.

In response to the new clock selector signal 84 for identifying the new reference clock signal 60 $RCS_I$, step 628 is performed, wherein the following substeps are performed:

(a) the multiplexer 72 corresponding to the reference clock signal $RCS_I$ determines that the clock selector signal 84 identifies it, and accordingly this multiplexer 72 outputs phase errors to the corresponding phase error register 64 ($PER_I$) instead of the corresponding phase offset register 68 ($POR_I$); e.g., if the multiplexer 72a corresponds to the clock signal $RCS_I$, then the multiplexer 72a outputs phase errors to the register 64a, and if the multiplexer 72b corresponds to the clock signal $RCS_I$, then multiplexer 72b outputs phase errors to the register 64b. Additionally, when $PER_I$ detects the clock selector signal 84 (via a corresponding one of the connectors 92), $PER_I$ is activated for receiving the multiplexer 72 output, and when $POR_I$ detects the clock selector signal 84, then $POR_I$ disables receiving input from the multiplexer 72;

(b) for the multiplexer 72 corresponding to the reference clock signals $RCS_0$, the clock selector signal 84 causes this multiplexer 72 to output phase errors to the corresponding phase offset register 68 $POR_0$ instead of the corresponding phase offset register 68 $PER_0$; e.g., if this multiplexer is 72a, then the multiplexer 72a outputs phase errors to the phase offset register 68a, and if this multiplexer is 72b, then the multiplexer 72b outputs phase errors to the phase offset register 68b. Additionally, when $POR_0$ detects the new clock selector signal 84 (via a corresponding one of the connectors 92), $POR_0$ is activated for receiving the multiplexer 72 output, and when $PER_0$ detects the clock selector signal 84, then $PER_0$ disables receiving input from the multiplexer 72;

(c) upon sensing the clock selector signal 84 (via the connector 96), the multiplexer 74 configures for outputting signals from $PER_f$;

(d) upon sensing the clock selector signal 84 (via the connector 104), the multiplexer 76 configures for outputting signals from $POR_f$.

Subsequently, in step 632, assignments and/or relabelings may be performed so that (a) the identifier $RCS_0$ now refers to the reference clock signals of $RCS_f$; (b) the identifier $PER_0$ now refers to the phase error register 64 of $PER_f$; and (c) the identifier $POR_0$ now refers to the phase offset register 68 of $POR_f$. Following step 632, step 614 is again performed.

Figure 7:
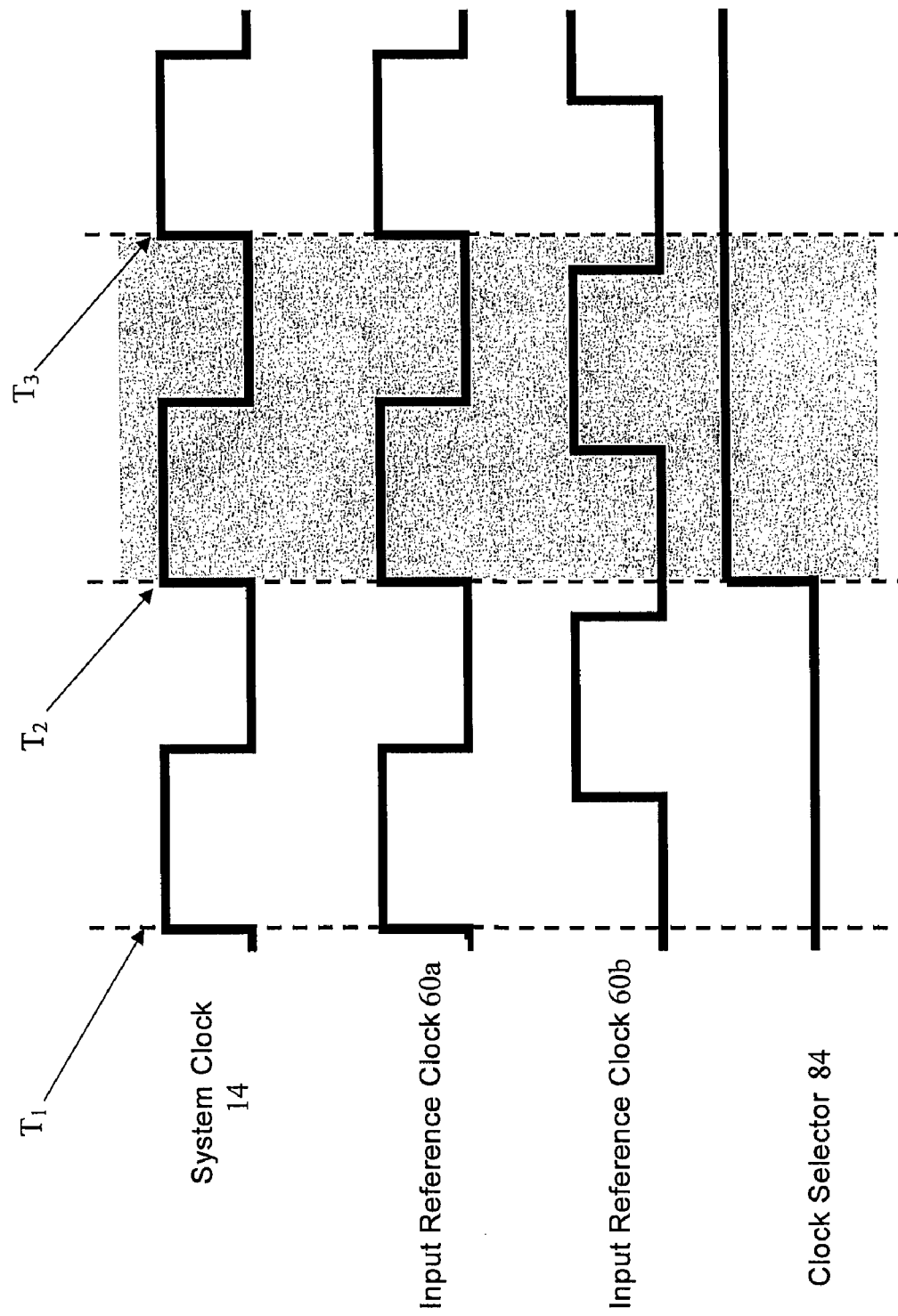
FIG. 7 shows an illustrative example of various clock signals prior to, during, and immediately after a switch over from a first reference clock signal 60a, to a second reference clock signal 60b.

FIG. 7 shows representative signals when a reference clock signal switch occurs. Initially, at time $T_1$, assume the system clock signals 14 are phase aligned with reference clock signals 60a. Accordingly, the phase error register 64a is zero, and the phase offset register 68a will be zero due to initialization (step 604, FIG. 6) or due to the value of this register being assigned to zero (step 614) when reference clock signals 60a and the system clock signals 14 are phase aligned. However, phase offset register 68b is being updated (via phase detector 32b) with the phase error between the reference clock signals 60b and the system clock signals 14. Subsequently, at time $T_2$, assume the clock selector signal 84 switches from zero to one indicating that reference clock signals 60b are to be used. Then the phase error register 64b receives the phase error between the reference clock signals 60b and the system clock signals 14, and registers 64b and 68b will at switchover have substantially identical values. Thus, immediately after the switchover, the phase error output to the low pass filter 88 is zero (or substantially so) as is shown at time $T_3$. However, assuming the system clock signals 14 are to be phase aligned with the reference clock 60b, in subsequent iterations of the step 614 (without an event being detected in step 620), the value in register 68b is modified (progressively) to zero, and accordingly, the system clock signals 14 gradually are shifted to be in phase alignment with reference clock signals 60b.

Figure 8:
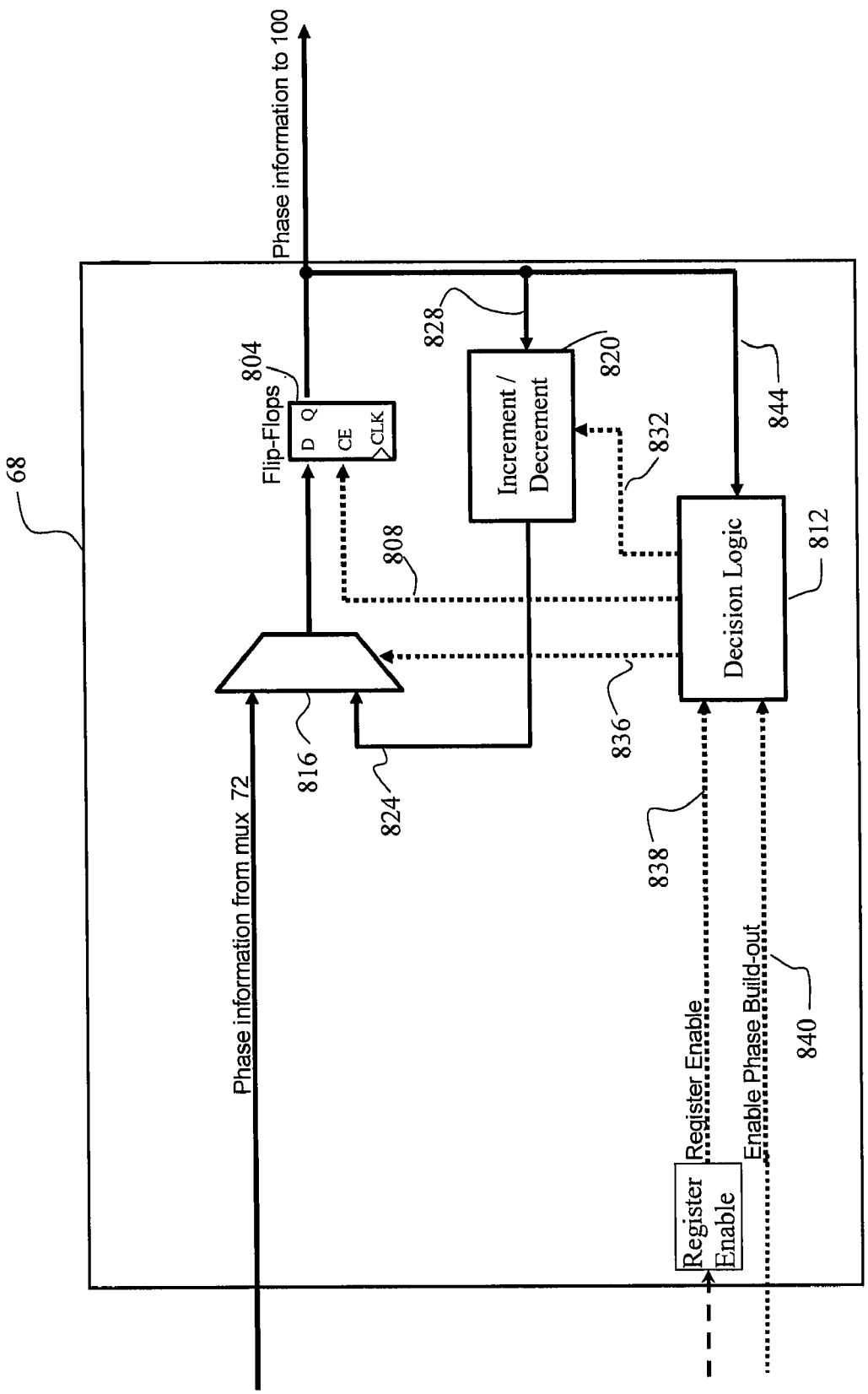
FIG. 8 is a high level circuit diagram of a phase offset register 68 for an embodiment of the clock synchronizer 58 wherein the system clock signal 14 is able to be gradually brought into phase alignment with a corresponding input reference clock signal 60.

FIG. 8 shows a high level schematic of a phase offset register 68 for an embodiment of the clock synchronizer 58 wherein the system clock signal 14 is able to be gradually brought into phase alignment with a current input reference clock signal 60. Accordingly, the phase offset register 68 includes a series of flip-flops 804 (i.e., a data register) for identifying phase offset values, and for providing such phase offset values to a corresponding one of the inverters 100 as shown. When the series 804 receives a "clock enable" signal (CE), via the connector 808, from the decision logic component 812, the series 804 is able to be updated by an output from the multiplexer 816. Alternatively, when the series 804 receives a "clock disable" signal via the connector 808, the series 804 can not be updated by any output from the multiplexer 816. The multiplexer 816 receives inputs from both the multiplexer 72 corresponding to the present phase offset register 68, and from an increment/decrement component 820. If a phase offset value identified in the series 804 is to be used to phase align the system clock 14 with the reference clock 60 corresponding to the present phase offset register 68, then the increment/decrement component 820 supplies a modified phase offset value (as per step 614, FIG. 6) to the multiplexer 816 via connector 824. Note that in order for the increment/decrement component 820 to determine such a modified phase offset value, this component receives (via connector 828) signals identifying the current phase offset value provided by the series 804. The decision logic component 812 activates the increment/decrement component 820, via connector 832, for outputting a modified phase offset value. Additionally, the decision logic component 812 also instructs the multiplexer 816, via connector 836, as whether to output the phase information received from the multiplexer 72, or to output a modified phase offset value determined by the increment/decrement component 820.

The decision logic component 812 provides the control for modifying the series 804. In doing so, the decision logic component 820 receives, via the connector 838, input from the corresponding register enable component (labeled "RE" in FIG. 5), which in turn receives reference clock selection signals via a corresponding one of the connectors 92 as described hereinabove. Additionally, the decision logic component 812 receives a control signal, via connector 840, from the computational system (not shown) for designating whether or not the system clock signals 14 are to be phase aligned with the reference clock 60 corresponding to the present phase offset register 68. The decision logic component 812 also receives (via connector 844) signals identifying the current phase offset value provided by the series 804. Accordingly, when provided with these inputs, the decision logic component 812 performs the following:

(1) Controls whether the increment/decrement logic component 820 is to add or subtract from the current phase offset information provided by the series 804. In particular, if the output from the series 804 is positive, then the increment/decrement logic component 820 is instructed (via the connector 832) to subtract a predetermined value from the phase offset information. If the output of the series 804 is negative, then the increment/decrement logic component 820 is instructed to add a predetermined value to the phase offset information.

(2) Controls the clock enable signal for the series 804 flip-flops. That is, the decision logic component 812 provides a signal, via connector 808, indicating whether the updating of the series 804 is enabled or disabled. The decision logic component 812 determines enabling and disabling as follows:

(a) If the register enable (RE) outputs an "enable" signal via connector 838, then the clock enable signal always enables the series 804 to be updated.

(b) If the register enable (RE) outputs a "disable" signal via connector 838, and the signal on connector 840 indicates that the phase offset information provided by the series 804 is to be used for phase aligning the system clock signals 14 with the current reference clock 60 (this phase alignment process denoted as "phase build-out") and the output from the series 804 is not zero, then the clock enable signal enables the series 804 to be updated.

(c) If the register enable (RE) outputs a "disable" signal via connector 838, and the phase build-out is disabled via a signal on connector 840, then the clock enable signal disables the series 804 from being updated.

(3) Controls the output of the multiplexer 816 to the flip-flop series 804. That is, the decision logic component 812 determines whether the phase error information from the corresponding multiplexer 72, or the output of the increment/decrement logic component 820 is to be selected for updating the series 804, and this determination is determined as follows:

(a) If the register enable (RE) outputs an "enable" signal via connector 838, then the phase error information from the corresponding multiplexer 72 is always selected.

(b) If the register enable (RE) outputs a "disable" signal via connector 838, and the phase build-out is enabled via a signal on connector 840, then the output from the increment/decrement logic component 820 is selected.

(c) If the register enable (RE) outputs a "disable" signal via connector 838, and the phase build-out signal on connector 840 indicates no phase build-out disabled, then it does not matter which input is selected.

The foregoing description has been presented for purposes of illustration and description. However, the description is not intended to limit the invention as claimed hereinbelow to the form disclosed hereinabove. Consequently, variations and modifications commensurate with the above teachings, within the skill and knowledge of the relevant art, are within the scope of the claims hereinbelow. In particular, note that since only one of phase error registers 64 is being used at any one time, in an alternative embodiment, each (or at least some) of the phase detectors 32 may provide phase errors to a common phase error register 64.

The embodiments described hereinabove are further intended to explain the best mode presently known of practicing the invention claimed hereinbelow, and to enable others skilled in the art to utilize the claimed invention in various embodiments, and with the various modifications required by their particular application or uses of the invention. Thus, it is intended that the appended claims be construed to include alternative embodiments to the extent permitted by the prior art.

The invention claimed is:

1. A clock synchronization device for phase aligning timing signals for a computational system to one of a plurality of reference clock signals, comprising:
   a clock selector for selecting between at least a first of the plurality of reference clock signals and an alternative of the plurality of reference clock signals for phase aligning the timing signals therewith;
   a phase locked loop for receiving the first reference clock signals, and the alternative reference clock signals;
   wherein the phase locked loop includes:
      (a) one or more phase error registers, wherein:
         (i) when the first reference clock signals are selected for phase aligning the timing signals, one of the one or more phase error registers repeatedly receives and stores data indicative of phase errors between the timing signals, and the first reference clock signals, and
         (ii) when the alternative reference clock signals are selected for phase aligning the timing signals, one of the one or more phase error registers repeatedly receives and stores data indicative of phase errors between the timing signals, and the alternative reference clock signals;
      (b) a first phase offset register corresponding to the first reference clock signals, wherein the first phase offset register repeatedly receives and stores data indicative of a phase error between the timing signals and the first reference clock signals, when the first reference clock signals are not selected by the clock selector for phase aligning the timing signals;
      (c) a second phase offset register corresponding to the alternative reference clock signals, wherein the second phase offset register repeatedly receives and stores data indicative of a phase error between the timing signals and the alternative reference clock signals, when the alternative reference clock signals are not selected by the clock selector for phase aligning the timing signals;
   wherein when the clock selector signals a switch from one of the first and alternative reference clock signals to the other of the first and alternative reference clock signals, the data in the one of the first and second phase offset registers corresponding to the other reference clock signals is:
      (d) combined with one of the phase error registers having data indicative of phase errors between the timing signals and the other reference clock signals for obtaining a phase error for correction, and
      (e) modified so that a subsequent combining with the one of the phase error registers having data indicative of phase errors between the timing signals and the other reference clock signals brings the timing signals into closer phase alignment with the other reference clock signals.

2. The clock synchronization device of claim 1, wherein the data in the corresponding one of the first and second phase offset registers is repeatedly combined with the one of the phase error registers, and modified so that a subsequent combining with the one of the phase error registers, and the other reference clock signals brings the timing signals into closer phase alignment with the other reference clock signals.

3. The clock synchronization device of claim 1, wherein the phase locked loop includes a numerically controlled oscillator.

4. A method for adjusting timing signals for a computational system with various ones of a plurality of reference clock signals, comprising:
   selecting one of the plurality of reference clock signals for adjusting the timing signals into being consistent with a timing characteristic of the selected reference clock signals;
   providing, for an alternative one of the plurality of reference clock signals that is different from the selected reference clock signals, a corresponding data register ($R_1$) for storing data indicative of the difference between the timing signals and the alternative reference clock signals;
   receiving a signal for selecting the alternative reference clock signals for adjusting the timing signals;
   for a signal detector receiving the alternative reference clock signals, a step of outputting a difference ($D_1$) between the timing signals and the alternative reference clock signals, at a time $T_1$, to a register ($R_2$) different from the register $R_1$;
   storing the difference $D_1$ as a value of the register $R_2$;
   determining a difference between the $R_1$ and $R_2$ for adjusting the timing signals;
   changing a value of the data register $R_1$ so that for a difference ($D_2$) between the timing signals and the alternative reference clock signals, at a time $T_2$, in the register $R_2$, a subsequent difference between the $R_1$ and $R_2$ is used for adjusting the timing signals into being more consistent with a timing characteristic of the alternative reference clock signals.

5. The method of claim 4, wherein the timing characteristic of at least one of the selected reference clock signals, and the alternative reference clock signals includes a signal phase.

6. The method of claim 4, further including a step of iteratively changing the value of the data register $R_1$ so that the value becomes closer or equal to a predetermined value.

7. The method of claim 4, further including outputting the subsequent difference to a low pass filter.

* * * * *